United States Patent [19]

Miyamoto

[11] Patent Number: 4,525,060
[45] Date of Patent: Jun. 25, 1985

[54] EXPOSURE APPARATUS

[75] Inventor: Hiroshi Miyamoto, Tokyo, Japan

[73] Assignee: Orc Manufacturing Co., Ltd., Tokyo, Japan

[21] Appl. No.: 489,315

[22] Filed: Apr. 28, 1983

[30] Foreign Application Priority Data

Apr. 28, 1982 [JP] Japan ............................ 57-62704[U]

[51] Int. Cl.³ .................. G03B 27/42; G03B 27/28
[52] U.S. Cl. ...................................... 355/53; 355/54; 355/72; 355/75; 355/125
[58] Field of Search ................. 355/43, 53, 45, 73, 355/75, 78, 79, 125, 126

[56] References Cited

U.S. PATENT DOCUMENTS 4,298,273  11/1981  Nishizuka et al. ................ 355/53
4,431,304  2/1984  Mayer ........................... 355/53 X Primary Examiner—Richard A. Wintercorn
Attorney, Agent, or Firm—Fidelman, Wolffe and Waldron

[57] ABSTRACT

An exposure apparatus for projecting a certain pattern predrawn on a printed board, an integrated circuit or the like on a sheet of film to print the pattern on the sheet. A mask body on which a certain pattern is drawn is held so that it can rotate relative to a film-like body, and when the mask body and the film-like body are held in a certain positional relation during exposure, no gap is formed between these bodies.

4 Claims, 2 Drawing Figures

EXPOSURE APPARATUS

BACKGROUND OF THE INVENTION

The present invention relates to a film exposure apparatus.

Heretofore, in film exposure apparatuses, a frame holding a mask body, such as a mask film or mask glass, has been disposed so as to be movable up and down relative to another frame holding a flat plate body having photosensitive material applied thereto or spreaded thereon (hereinafter simply referred to "photosensitive flat plate body"). The frame holding the mask body is moved up and down relative to the frame holding the photosensitive flat plate body to place the mask body on the flat plate body, and the air between these bodies is evacuated so that they come into close contact with each other before exposure operation.

Because the flat body and the mask body are held by their respective frames and because they are so constructed that when these bodies are in contact with each other the mask bears against the flat plate body, if the thickness of the flat plate body is uniform, then no problem arises even when a conventional exposure apparatus is used.

However, the thickness of photosensitive flat body is not always uniform. For example, in a case where a cross section of a photosensitive flat plate body takes a trapezoidal form and tapers off toward its one side, even if a frame holding the flat body and a frame holding a mask body are in contact with each other, the mask body is not totally in contact with the whole opposed surface of the flat plate body in a conventional exposure apparatus. Therefore, an undesirable space exists locally between the opposed surfaces of the bodies. When such a situation occurs, a certain pattern drawn on the mask body lying on or below the space is not precisely projected on the flat plate body, whereby accurate exposure of mask pattern cannot be obtained. This is a serious disadvantage.

In view of the foregoing, it is the object of the present invention to provide an exposure apparatus which has a simple construction and is free from the aforementioned disadvantage.

This object is achieved, in accordance with the present invention, by holding a frame that holds a mask body such that the frame can rotate about at least one imaginary straight line passing through the center point of the held mask body.

DETAILED DESCRIPTION OF THE INVENTION

Figure 1:
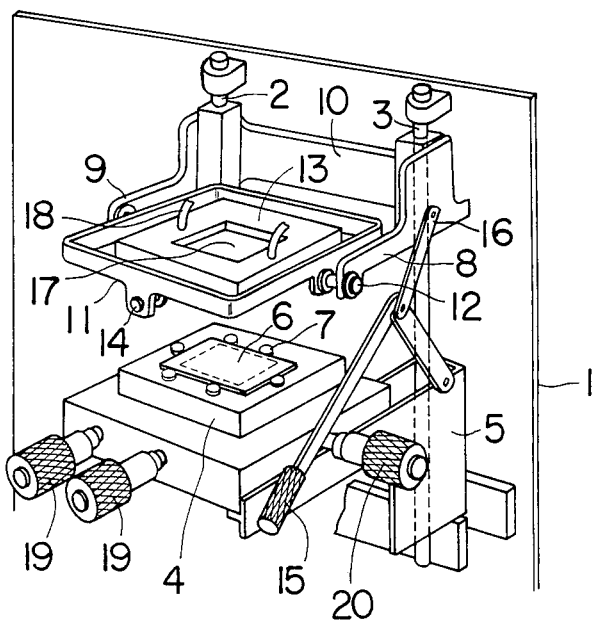
FIG. 1 is a perspective view of an exposure apparatus according to the present invention.

Referring to the drawing, there is shown an exposure apparatus embodying the concept of the invention. The envelope of the apparatus includes a side plate 1, to which guide poles 2 and 3 are securely fixed in a parallel relation to the side plate.

Mounted on each of the poles 2 and 3 at right angles thereto is a frame holder 5, to which a frame 4 holding a photosensitive flat plate body 6 is fixedly secured. Photosensitive material is applied to, or spreaded on, the plate body 6, which is positioned and held by claws 7 on the frame 4.

The portion of the holder 5 which is opposed to the flat plate body 6 is made hollow so that light emanating from an exposure light source (not shown) disposed below the holder 5 can be projected on the plate body 6.

A support 10 having arms 8 and 9 is secured to the poles 2 and 3 in such a manner that the support can move up and down. Pivotally secured to the arms 8 and 9 is a support frame 11 which has a shaft 12 about which the frame 11 can swing. A frame 13 for holding an upper mask body is pivotally secured to the frame 11 so that it can swing in a direction perpendicular to the axis about which the frame 11 rotates. The frame 13 has a shaft 14 about which it can swing, and an upper mask body 17 is mounted on the underside of the frame 13 such that its center is located near the intersection of the two perpendicular axes about which the frame 13 can rotate. Extending through the frame 13 are pipes 18 for evacuation.

Pivotally secured to the aforementioned frame holder 5 is an angular lever 15 whose bent portion is connected to the support 10 via a link 16. Thus, when the lever 15 is rotated in a counterclockwise direction, the support 10 is guided downward by the guide poles 2 and 3 via the link 16.

The position of a lower mask body disposed below the flat plate body 6 is adjusted relative to the upper mask body by controlling knobs 19 and 20, which do not constitute the present invention per se. Therefore, these knobs are not described in detail herein.

In the operation of the construction described so far, when the lever 15 is pushed down, it rotates in a counterclockwise direction. This causes the link 16 to lower the support 10 along the poles 2 and 3, and the frame 13 holding the upper mask body is lowered. Therefore, the frames 4 and 13 move toward each other until the photosensitive flat plate body 6 comes into contact with the upper mask body 17.

Figure 2:
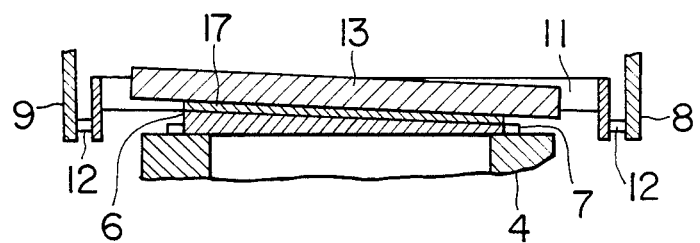
FIG. 2 is a fragmentary sectional view of the apparatus of FIG. 1.

Under this condition, even if a cross section of the plate body 6 tapers off toward its one side, the frame 13 rotates relative to the support frame about the shafts 12 and 14. The result is that the upper mask body 17 is in contact with the whole opposed surface of the plate body 6 as shown in FIG. 2.

In this condition, in the same manner as conventional, the air existing around the flat body 6 and the upper mask body 17 is evacuated through the pipes 18 to bring the bodies 6 and 17 into close contact with each other. Consequently, such a situation is avoided that a space is produced between the flat body 6 and the upper mask body 17 as experienced in a conventional exposure apparatus when the thickness of the flat body is not uniform and a cross section of the body 6 tapers off toward its one side, for example.

This gapless, close contact between the bodies 17 and 6 can be automatically achieved only by the force applied to lower the frame 13 and so no special operation is required for such a contact. Also, because the frame 13 or the upper mask body 17 can move angularly relative to the flat plate body 6 about the shafts 12 and 14 whose axes perpendicularly intersect each other at the center of the underside of the mask body 17, the upper mask body 17 can be displaced so as to follow the inclined posture of the flat plate body 6 reasonably with certainty, irrespective of the direction in which the flat upper surface of the flat plate 6 is inclined. Thus, the lower surface of the upper mask body 17 can be brought into close contact with the upper surface of the plate 6.

As can be understood from the description made thus far, in accordance with the present invention, a photosensitive flat plate body and a mask body can be brought into close contact with each other over their whole opposed surfaces, even if the thickness of the plate body is not uniform, by disposing a mask body holder so that it can rotate about at least one axis passing through near the center of the mask body.

What is claimed is:

1. Film exposure apparatus comprising first frame means, a photosensitive flat plate body secured to said frame means, a second frame means positioned above said first frame means and vertically moveable with respect thereto for engagement therewith, a mask body mounted on said second frame means in vertical alignment with said photosensitive flat plate body, said second frame means being rotatable about at least one axis passing through near the center point of said mask body wherein when said mask body is brought into close contact with said photosensitive flat plate body over their respective whole opposed surfaces, and means to move said second frame means into engagement with said first frame means.

2. Film exposure apparatus as called for in claim 1 wherein said second frame means is pivotally mounted for movement about two diametrically opposed axis.

3. Film exposure apparatus comprising first frame holding means, support means holding said first frame holding means in substantially fixed, right angled relationship thereto, first frame means mounting on said frame holding means, a photosensitive flat plate body secured to said frame means, vertically disposed pole means mounted on said support means and extending above said frame holding means, second frame holding means mounted on said rod means above said first frame means and in right angled relationship thereto and in vertically moveable relationship thereon, second frame means mounted on said vertically moveable second frame holding means, a mask body mounted on said second frame means in vertical alignment with said photosensitive flat plate body, and means connected between said first frame holding means and said second frame holding means to vertically move said mask body into registry and surface contact with said photosensitive flat plate body, said second frame means being rotatable within said second frame holding means about at least one axis passing through near the center point of said mask body wherein when said mask body is brought into close contact with said photosensitive flat plate body over their respective whole opposed surfaces.

4. Film apparatus as called for in claim 3, wherein said second frame means is pivotally mounted with said second frame holding means for movement about two diametrically opposed axis.

* * * * *